US006496056B1

(12) United States Patent
Shoji

(10) Patent No.: US 6,496,056 B1
(45) Date of Patent: Dec. 17, 2002

(54) PROCESS-TOLERANT INTEGRATED CIRCUIT DESIGN

(75) Inventor: Masakazu Shoji, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/264,070

(22) Filed: Mar. 8, 1999

(51) Int. Cl.[7] .................................................. G05F 3/02
(52) U.S. Cl. ........................ 327/543; 327/538; 327/541
(58) Field of Search ............................ 327/543, 57, 99, 327/291, 293, 512, 513, 307, 362, 538, 541; 331/109

(56) References Cited

U.S. PATENT DOCUMENTS 3,970,875 A * 7/1976 Leehan ........................ 327/543
5,359,302 A * 10/1994 Balusek ........................ 331/109
5,831,472 A * 11/1998 Wang et al. ................. 327/543

OTHER PUBLICATIONS

M. Shoji, "Elimination of Process–Dependent Clock Skew in CMOS VLSI," IEEE Journal of Solid–State Circuits, vol. SC–21, No. 5, pp. 875–880, Oct. 1986.

* cited by examiner

Primary Examiner—Tuan T. Lam
Assistant Examiner—Hiep Nguyen
(74) Attorney, Agent, or Firm—Ryan, Mason & Lewis, LLP

(57) ABSTRACT

An operating parameter of an integrated circuit is made substantially insensitive to process variations by configuring the circuit such that an environmental parameter, e.g., supply voltage to a portion of the circuit, is made a function of one or more process parameters, e.g., conduction threshold voltages and mobilities in that portion of the circuit. In this manner, the effect of the process parameters on the circuit operating parameter may be partially or substantially offset by the effect of the process parameters on the environmental parameter. In an illustrative embodiment, the circuit operating parameter is an oscillation period of a ring oscillator. A voltage regulator generates a reference voltage which is determined at least in part based on known process parameter variations in the ring oscillator. The ring oscillator utilizes the reference voltage generated by the voltage regulator as its supply voltage, and its oscillation period is thereby made insensitive to the process parameter variations. In addition, back-bias effects may be introduced in the voltage regulator to compensate back-bias effects resulting from particular configurations of the ring oscillator. The design techniques of the invention may be applied to a wide variety of different types of integrated circuits, operating parameters, environmental parameters and process parameters.

20 Claims, 4 Drawing Sheets

PROCESS-TOLERANT INTEGRATED CIRCUIT DESIGN

FIELD OF THE INVENTION

The present invention relates generally to process-tolerant design techniques for use in complementary metal-oxide-semiconductor (CMOS) integrated circuits or other types of electronic circuits.

BACKGROUND OF THE INVENTION

Process variations are an important consideration in the design of many different types of integrated circuits. FIG. 1 shows a portion of a CMOS integrated circuit 10 which serves to illustrate the impact of process variations on circuit performance. The circuit 10 includes a phase-locked loop (PLL) 12, a voltage-controlled oscillator (VCO) 14, and a voltage regulator circuit 16. The voltage regulator circuit 16 generates a regulated output voltage from a generally variable supply voltage $V_{DD}$. The variation in the supply voltage $V_{DD}$ is often on the order of ±20% of its nominal value.

The regulated voltage is supplied to the VCO 14 and thereby to the PLL 12. The PLL 12 receives an input stream and generates a control voltage which adjusts the frequency of the VCO output such that the PLL output is phase-locked with the input stream. The circuit 10 is often required to operate at frequencies at or above the GHz range, and must meet specified performance criteria in the presence of variation in the supply voltage $V_{DD}$, e.g., a ±20% variation. In addition, the circuit 10 must meet the specified performance criteria in the presence of variations in the CMOS wafer processes used to construct the circuit.

In the circuit 10, the voltage regulator circuit 16 serves to remove the variation in the supply voltage $V_{DD}$, and the effects of the process variations are dealt with using the negative feedback loop between the PLL 12 and the VCO 14. The output of the voltage regulator circuit 16 is in the form of a constant voltage independent of any variation in the supply voltage $V_{DD}$, and may be generated using a so-called bandgap voltage reference circuit. In order to provide sufficient margin to accommodate the specified variation in $V_{DD}$, the regulator output voltage is generally made somewhat lower than the expected minimum $V_{DD}$ value, typically about $V_{BE} \approx 600$ millivolts or more lower than the expected minimum $V_{DD}$ value. As the $V_{DD}$ value is reduced, e.g., from 5 volts to 3.3 volts to 2.5 volts depending on the circuit implementation and CMOS process used, it becomes increasingly difficult to provide the desired amount of voltage margin.

With regard to the process variations, the control voltage from the PLL 12 to the VCO 14 in circuit 10 will generally vary depending on these variations, even if the operating frequency of the circuit remains unchanged. For example, if an N-channel field effect transistor (NFET) controls the VCO delay, the control voltage to the VCO will be higher if the process shifts to its slower side. This type of variation further narrows the design margin.

Conventional integrated circuit design techniques, such as those used to address supply voltage variations and process variations in the circuit 10 of FIG. 1, are insufficiently tolerant to these types of variations, particularly as $V_{DD}$ is reduced, e.g., below 3.3 volts. Moreover, such techniques are generally unable to make time-varying circuit operating parameters substantially independent of process variations. A need therefore exists for improved integrated circuit design techniques.

SUMMARY OF THE INVENTION

The invention makes an operating parameter of an integrated circuit substantially insensitive to process variations by configuring the circuit such that an environmental parameter which affects the opeating parameter is made a function of one or more process parameters. In this manner, the effect of the process parameters on the circuitoperating parameter may be partially orsubstantially offset by the effect of the process parameters on the environmental parameter. Examples of environmental parameters which may be used in this compensation technique include power supply voltage, current generator control voltages, active load control voltage, back-bias voltage, and operating temperature. Examples of.process parameters suitable for use in this, compensation technique include conduction ethreshold voltage, channel nobility, gate capacitance, drain capacitance, Early voltage, saturation parameter, transit time and other parameters associated with the field effect transistors (FETs) of the integrated circuit.

In an illustrative embodiment, the circuit operating parameter is an oscillation period of a ring oscillator. A voltage regulator generates a reference voltage which is determined at least in part based on known process parameter variations in the ring oscillator. The ring oscillator utilizes the reference voltage generated by the voltage regulator as its power supply voltage, and its oscillation period is thereby made insensitive to the process parameter variations. In addition, back-bias effects may be introduced in the voltage regulator to compensate back-bias effects resulting from particular configurations of the ring oscillator.

The design techniques of the invention may be applied to a wide variety of different types of circuits, operating parameters, environmental parameters and process parameters. In addition, the invention allows a circuit operating parameter which varies as a function of time, such as the above-noted oscillation period, to be made substantially process independent. The invention can be applied, e.g., to produce fixed operation frequency integrated circuits at high yield, and to achieve specified performance at low power supply voltages, e.g., on the order of 2 volts or less. The process variation tolerant design techniques of the present invention are particularly well-suited for use in high-speed CMOS integrated circuit applications, although as previously noted the invention is also suitable for use with other types of circuits. These and other advantages and features of the present invention will become more apparent from the accompanying drawings and the following detailed description.

DETAILED DESCRIPTION OF THE INVENTION

The present invention will be illustrated below in conjunction with exemplary integrated circuits including ring oscillators and voltage regulators. It should be understood, however, that the invention is not limited to use with any particular type of circuit, but is instead more generally applicable to any electronic circuit or device in which it is desirable to provide improved tolerance to process variations.

Figure 2:
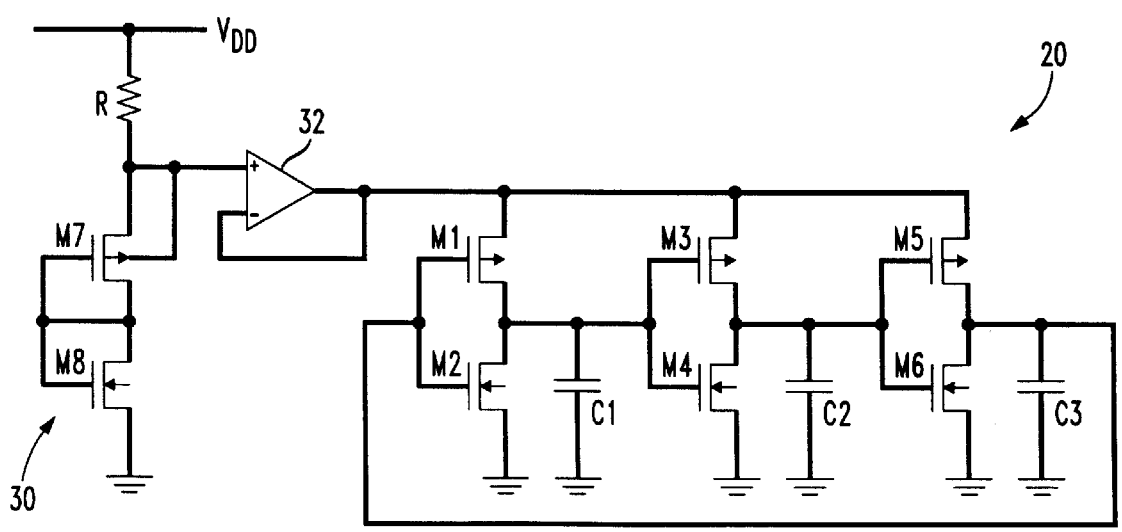
FIGS. 2 and 3 show first and second embodiments of the invention, respectively, in which a regulated voltage is applied to a ring oscillator circuit.

FIG. 2 shows an illustrative embodiment of the invention, including a ring oscillator circuit 20 and a voltage regulator circuit 30. The ring oscillator circuit 20 includes three stages of cascaded inverters. The cascaded inverters are formed by pairs of transistors M1-M2, M3-M4 and M5-M6. 10 The ring oscillator circuit 20 also includes capacitors $C_1$, $C_2$ and $C_3$, which may represent parasitic capacitances of the transistors. The voltage regulator circuit 30 includes transistors M7 and M8, and a load resistor R. A voltage follower-scaler 32 is coupled between a reference voltage output of the voltage regulator circuit 30 and an effective $V_{DD}$ voltage input of the ring oscillator circuit 20. The voltage follower-scaler 32 may be viewed as part of the voltage regulator circuit 30. The designation "M" followed by a number is used herein to refer to a metal-oxide-semiconductor (MOS) field effect transistor (FET). Devices M1, M3, MS and M7 are P-channel FETs (PFETs), and devices M2, M4, M6 and M8 are N-channel FETs (NFETs). The sources of the NFET devices M2, M4, M6 and M8 are connected to ground or $V_{SS}$. In accordance with the invention, as will be described in greater detail below, the voltage regulator circuit 30 is designed to generate a regulated reference voltage $V_{REF}$ which is selected such that the oscillation period of the ring oscillator circuit 20 is substantially independent of process variations. The voltage regulator circuit 30 thus generates a voltage which when applied to the ring oscillator cancels or minimizes the effects on the oscillation period which would otherwise be associated with process variations.

Figure 1:
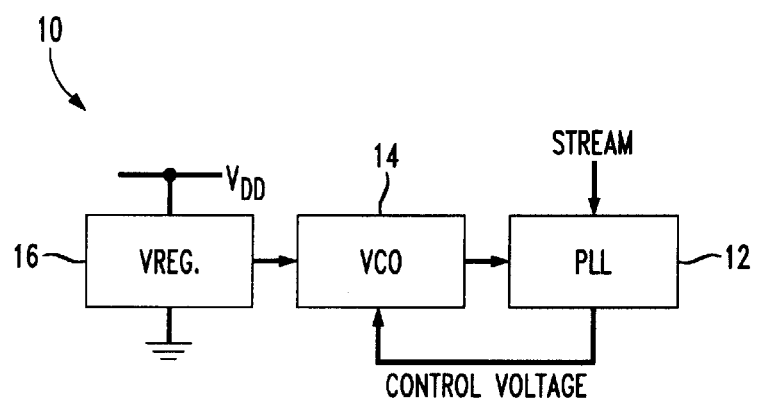
FIG. 1 shows a block diagram of a portion of a conventional integrated circuit.
Figure 3:
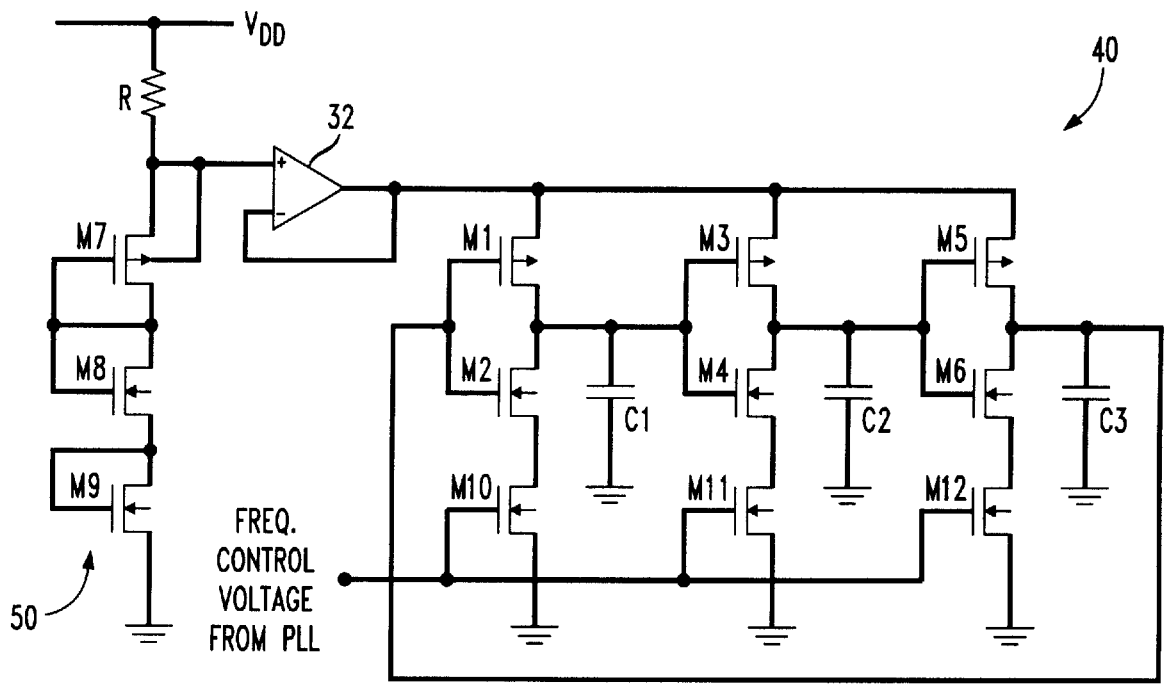

FIG. 3 shows another illustrative embodiment of the invention which includes a voltage-controlled ring oscillator circuit 40 and a voltage regulator circuit 50. The ring oscillator circuit 40 includes the elements of the ring oscillator circuit 20 as previously described, and three additional NFETs M10, M11 and M12 arranged as shown. The gates of the NFETs M10, M11 and M12 are coupled to a frequency control voltage input of the oscillator circuit 40 as supplied from, e.g., a PLL such as PLL 12 of FIG. 1. The voltage regulator circuit 50 includes the elements of the voltage regulator circuit 30 as previously described, and an additional NFET M9 which has its source connected to ground or $V_{SS}$, and its gate and drain connected to the source of the NFET M8. The use of an additional NFET in the voltage regulator circuit 50 creates an additional back-bias effect to compensate for the back-bias effects which arise due to the fact that the NFETs M2, M4 and M6 in the ring oscillator 40 are no longer connected directly to ground or $V_{SS}$.

Figure 4:
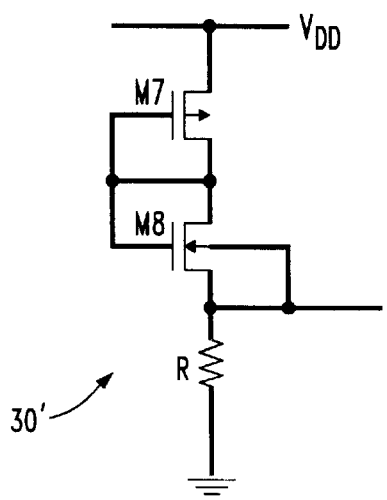
FIGS. 4 and 5 show alternative implementations of a voltage regulator circuit suitable for use in the embodiments of FIGS. 2 and 3, respectively.
Figure 5:
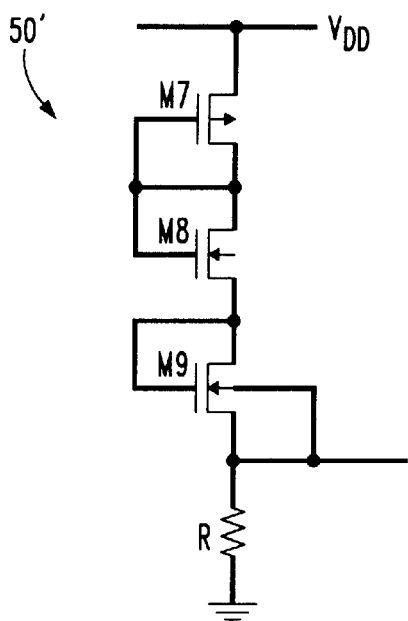

FIGS. 4 and 5 show alternative implementations of the voltage regulator circuits 30 and 50 of FIGS. 2 and 3, respectively. The voltage regulator circuit 30' of FIG. 4 includes PFET M7, NFET M8 and load resistor R as in the FIG. 2 embodiment, but with the source of the NFET connected to the load resistor, and the PFET connected directly to the supply voltage $V_{DD}$. Similarly, the voltage regulator circuit 50' of FIG. 5 includes PFET M7, NFETs M8 and M9 and load resistor R as in the FIG. 3 embodiment, but with the source of the NFET M9 connected to the load resistor R, and the PFET connected directly to the supply voltage $V_{DD}$. The circuits of FIGS. 4 and 5 are suitable for use in, e.g., an N-substrate CMOS circuit that has an independent P-tub.

The manner in which the voltage regulator circuit is designed to provide a substantially process-independent oscillation period will be described using the ring oscillator circuit 20 of FIG. 2. It should be understood, however, that the analysis may also be applied to the embodiment of FIG. 3, and to many other types of circuits.

Figure 6:
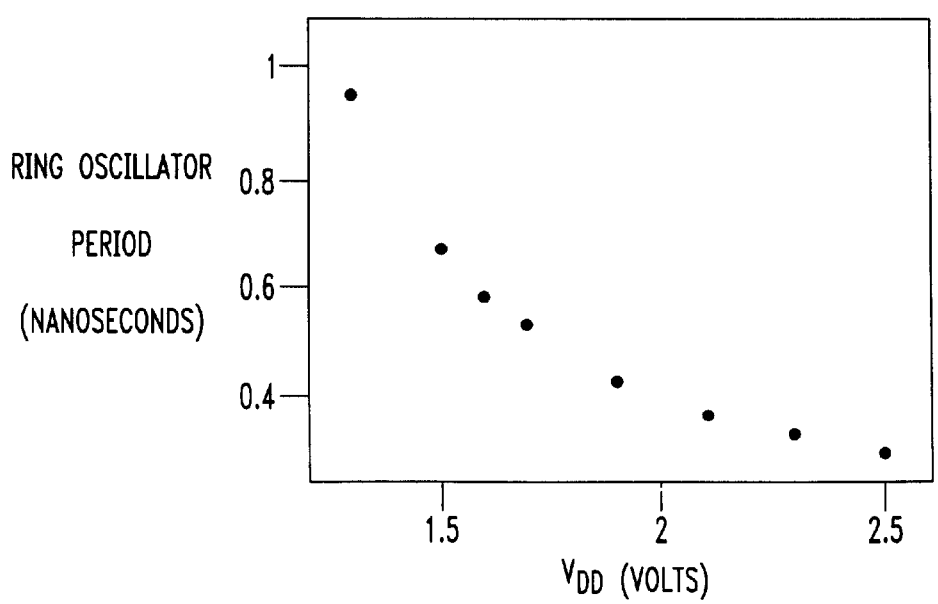
FIG. 6 illustrates the variation in oscillation period as a function of supply voltage $V_{DD}$ in a ring oscillator circuit which is driven directly by $V_{DD}$ without voltage regulation.

FIG. 6 shows the oscillation period of the three-stage ring oscillator circuit 20 of FIG. 2. It is assumed for purposes of the following analysis that the PFETs Ml, M3 and M5 in the ring oscillator circuit 20 are each implemented as the second minimum size PFET in a 0.25 micron CMOS process at 85°, and that the NFETs M2, M4 and M6 in circuit 20 are implemented as the minimum size NFET in this process. It can be seen from the plot that the oscillation period increases as $V_{DD}$ is reduced. The curve becomes quite steep if $V_{DD}$ is reduced below $V_{THN}+V_{THP}$, where $V_{THN}$ and $V_{THP}$ are the conduction threshold voltages of the NFET and PFET, respectively. In this illustrative embodiment, these conduction threshold voltages are determined neglecting the sub-threshold conduction current of the FETs. Then, if the process variation shifts in the direction of increasing $V_{THN}$ or $V_{THP}$, the regulator output voltage is increased accordingly, and the oscillation period is maintained approximately constant.

The ring oscillator circuit 20 of FIG. 2, whose output when driven by $V_{DD}$ is characterized by the plot of FIG. 6, was analyzed to illustrate the benefits obtained by utilizing compensation of process variations in accordance with the invention. In this analysis, a gradual-channel, low-field MOSFET model was used. The NFET current $I_{DN}$ is given by this model as:

$$I_{DN}=0 \text{ for } V_G \leq V_{THN};$$

$$I_{DN}=B_N[V_G-V_{THN}-(\frac{1}{2})V_D]VD \text{ for } (V_G>V_{THN} \text{ and } V_D \leq V_G-V_{THN});$$
and $$I_{DN}=(B_N/2)(V_G-V_{THN}) \text{ otherwise.}$$

The PFET current $I_{DP}$ can be found using the above equations with the following substitution:

$$B_N \rightarrow B_P, V_{THN} \rightarrow V_{THP}, V_G \rightarrow V_{DD}-V_G, V_D \rightarrow V_{DD}-V_D$$

The following values, in normalized units, were used in the analysis:

$$V_{DD}=0.8, V_{THN}=V_{THP}=0.2, B_N=B_P=1.0, \text{ and } C=1.0,$$

where C is the node capacitance. $V_{DD}$ is set at 0.8 and not at 1.0, since the voltage range from 0.8 to 1.0 is used to compensate for the process variation. In this standard operating condition, the oscillation period was 25.2728, in normalized units based on normalized capacitance value divided by normalized FET transconductance values. This oscillation period value for the standard operating condition will be referenced below for comparison purposes. A small variation of the $V_{DD}$ and of the process parameters from the standard operating condition created variation in the oscillation period as shown in TABLES 1 and 2 below. Since the oscillator is most likely to be designed with pull-up/pull-down symmetry to achieve a good clock waveform, the analysis assumes that $V_{THN}=V_{THP}$ and $B_N=B_P$, as noted above. In sub-0.25 micron CMOS, a P+N+polysilicon process will be used, and therefore it is justified to assume equal conduction threshold voltages $V_{THN}=V_{THP}$, and a symmetrical buffer-inverter. Then the variation of $V_{THN}$ and $V_{THP}$, and of $B_N$ and $B_P$, create the same period variation. This restriction is not essential, however, for the integrity of this illustrative design strategy.

TABLE 1

Oscillation Period Versus Parameter Variation

| $V_{DD}$ | Period | $V_{THN}$ | Period | $V_{THP}$ | Period |
|---|---|---|---|---|---|
| 0.9 | 20.7407 | 0.15 | 23.1581 | 0.15 | 23.1581 |
| 0.8 | 25.2728 | 0.20 | 23.2728 | 0.20 | 23.2728 |
| 0.7 | 32.1229 | 0.25 | 27.7941 | 0.25 | 27.7941 |

TABLE 2

Oscillation Period Versus Parameter Variation

| $B_N$ | Period | $B_P$ | Period |
|---|---|---|---|
| 1.1 | 24.1050 | 1.1 | 24.1050 |
| 1.0 | 25.2728 | 1.0 | 25.2728 |
| 0.9 | 26.6580 | 0.9 | 26.6580 |

From the above data, the oscillation period $T_P$ of the ring oscillator 20 may be written as follows:

$$T_P = 25.2728 - 56.9125\Delta V_{DD} + 46.34(\Delta V_{THN} + \Delta V_{THP}) - 12.765(\Delta B_N + \Delta B_P),$$

where $\Delta V_{DD} = V_{DD} - 0.8$, $\Delta V_{THN} = V_{THN} - 0.2$, $\Delta B_N = B_N - 1.0$, and so on, represent the parameter variations from the standard operating condition. In order to make the oscillation period T. independent of these variations, the variation terms must satisfy the following formula:

$$\Delta V_{DD} = 0.814(\Delta V_{THN} + \Delta V_{THP}) - 0.2243(\Delta B_N + \Delta B_P)$$

If the output voltage of the regulator circuit 30 in the FIG. 2 embodiment is adjusted to satisfy this formula, the oscillation period remains unchanged, at the period associated with the standard condition, despite the parameter variations.

In order to illustrate the effectiveness of the above-described parameter compensation of the invention, two extreme conditions, a "slow" condition and a "fast" condition, were examined. The slow and fast conditions represent conditions in which the process parameters $V_{THN}$, $V_{THP}$, $B_N$ and $B_P$ are at the slow and fast ends, respectively, of the range of process variations for these parameters. In the slow condition, the process parameters were assumed to be $V_{THN} = 0.25$, $V_{THP} = 0.24$, $B_N = 0.70$, and $B_P = 0.80$. The resulting compensated $V_{DD}$ is 0.9854, and the oscillation period is 27.3424. If $V_{DD}$ is kept at 0.8, the period is 40.0682. In the fast condition, the process parameters were assumed to be $V_{THN} = 0.19$, $V_{THP} = 0.17$, $B_N = 1.10$, and $B_P = 1.30$. The resulting compensated $V_{DD}$ is 0.6777, and the oscillation period is 26.1793. If $V_{DD}$ is kept at 0.8, the period is 19.6978. For the standard condition, the period was 25.2728, as mentioned above. It is apparent from the foregoing that the use of a compensated $V_{DD}$ value determined in accordance with the invention has the effect of significantly reducing the variation in the oscillation period relative to the variation which would result without the compensation.

Figure 7:
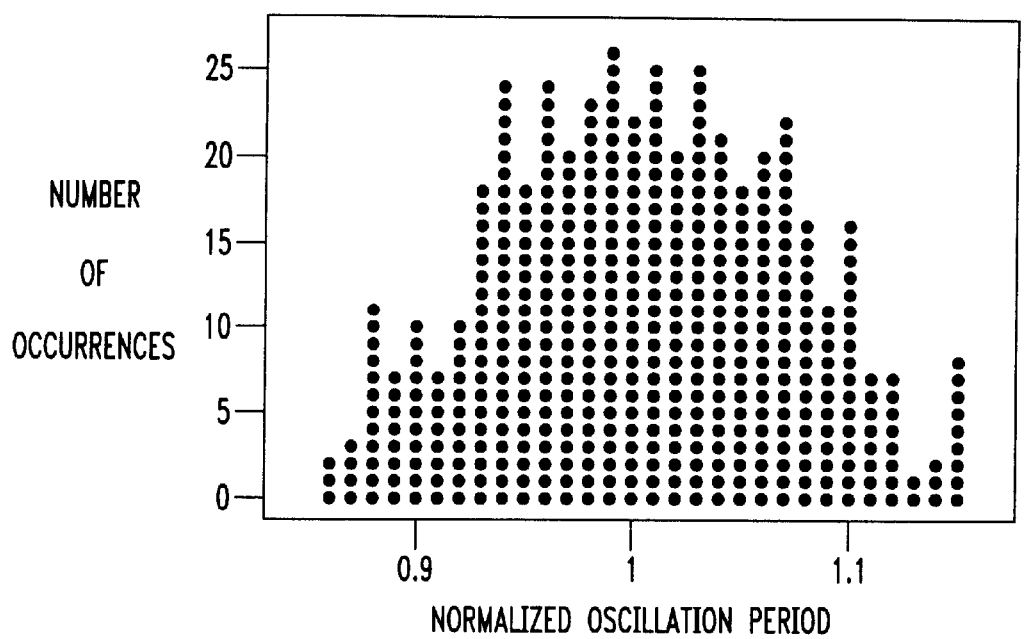
FIGS. 7 and 8 show histograms of normalized oscillation period for uncompensated and compensated ring oscillator circuits, respectively, as determined by statistical analysis.
Figure 8:
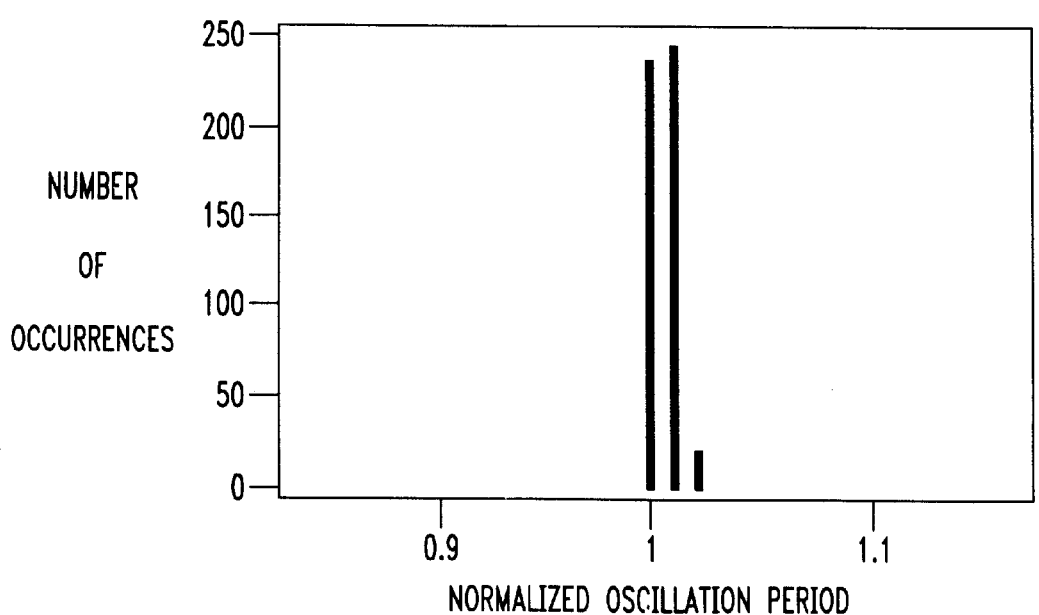

FIGS. 7 and 8 show histograms of the normalized oscillation period for the uncompensated case and the compensated case, respectively, based on the above-described analysis. It was assumed that the $V_{THN}$, $V_{THP}$, $B_N$ and $B_P$ process parameters vary independently of each other by ±15% centered at their respective nominal values. This variation is typical of practical CMOS processes, and is consistent with the ±15% $V_{DD}$ variation found in many applications. In a C-language program used to generate the above-described model of the ring oscillator circuit 20, values for these parameters were randomly generated using conventional Monte Carlo analysis. The oscillation period was computed for a case in which $V_{DD}$ is maintained at 0.8, i.e., the case in which $V_{DD}$ is uncompensated, and FIG. 7 shows the results for 500 randomly generated values of the process parameters $V_{THN}$, $V_{THP}$, $B_N$ and $B_P$. FIG. 8 shows the results for the case in which $V_{DD}$ is compensated using the techniques of the invention, again for 500 randomly generated values of the process parameters $V_{THN}$, $V_{THP}$, $B_N$ and $B_P$. These results indicate that a substantial improvement in oscillation period stability is obtained using the techniques of the invention. The variation in oscillation period attributable to process variation is reduced from about +10% in the uncompensated case to about +1% in the compensated case.

In order to make the ring oscillator supply voltage depend on the process parameters $V_{THN}$, $V_{THP}$, $B_N$ and $B_P$, the voltage regulator circuits 30 of FIG. 2, 50 of FIG. 3, 30 ' of FIG. 4, and 50' of FIG. 5 generate a reference voltage $V_{REF}$ which is of the form:

$$V_{REF} = aV_{THN} + bV_{THP} + cB_N + dB_P,$$

where the values of a, b, c and d are selected such that the voltage applied to the ring oscillator circuit, i.e., circuit 20 of FIG. 2 or circuit 40 of FIG. 3, satisfies the previously-described relationship between the parameter variation terms. As shown in FIGS. 2, 3, 4 and 5, the voltage regulator circuit includes a series-connected PFET M7 and NFET M8, and a load resistor R. The voltage developed by the series-connected FETs is, e.g., voltage scaled or impedance reduced by voltage follower-scaler 32, using well-known analog circuit techniques.

It should be noted that although the load resistor R should have a small process variation, i.e., it should be a precision resistor, its particular value is not extremely critical. The load resistor R may be an external resistor, i.e., an "off-chip" resistor, or may be formed internal to the integrated circuit as part of the CMOS process. In a CMOS process, one type of resistor is generally more precisely defined than the others. For example, in a P-type substrate CMOS process, an N+resistor, typically formed as a long strip structure of the NFET source, is generally the most precisely defined resistor, while in an N-type substrate CMOS process, a P+resistor, typically formed as a long strip structure of the PFET source, is generally the most precise. The load resistor R in the FIG. 2 voltage regulator circuit 30 may be an N+resistor, and the load resistor R in the FIG. 4 voltage regulator circuit 30' may be a P+resistor. The load resistor may be replaced with another suitable current generator. Circuit simulations may be used to determine the appropriate parameters for the load resistor or current generator.

Additional details relating to connection of the PFET M7 and the NFET M8 in the voltage regulator circuits of FIGS. 2 and 4 will now be described. Referring initially to the voltage regulator circuit 30 of FIG. 2, the CMOS substrate may be a P-type substrate with isolated N-tubs, such that the PFET M7 can be considered an independent device. In this case, the NFET M8 source is connected to ground or $V_{SS}$, the NFET drain is connected to the NFET gate, the PFET drain and the PFET gate, and the PFET source and the PFET N-tub are connected together to the load resistor R. Note that M7 in this case is a completely independent PFET having its own N-tub. Referring now to the voltage regulator circuit 30' of FIG. 4, the CMOS substrate may be an N-type substrate with isolated P-tubs, such that the NFET M8 can be considered an independent device, i.e., a completely independent NFET having its own P-tub. In this case, the PFET source is automatically connected to $V_{DD}$, the PFET drain is connected to the PFET gate, the NFET drain and the NFET gate, and the NFET source and N-type substrate are connected to the load resistor R.

The above-described types of connections are used to avoid back-gate bias effects. However, if the target circuit to be compensated using the techniques of the invention has FETs whose sources are not directly connected to ground or $V_{SS}$ (NFET) or $V_{DD}$ (PFET), then the additional back-bias effect can be conveniently used to obtain even more precise compensation. The voltage developed across the FETs in such an embodiment is an indicator of the speed of the circuit, and includes both 151 the conduction threshold voltages $V_{THN}$ and $V_{THP}$, and the mobilities $B_N$ and $B_P$. For example, as noted previously in conjunction with the embodiment of FIG. 3, the additional back-bias effects of NFETs M2, M4 and M6 are compensated by the back-bias effect which results by not connecting M8 directly to ground or $V_{SS}$.

In the illustrative embodiments of FIGS. 2 and 3, a circuit operating parameter which would otherwise vary as a function of wafer processing variations, i.e., the oscillation period of the ring oscillator circuit, is made substantially insensitive to such process variations. This improvement is provided by selecting the voltage applied to the ring oscillator circuit, i.e., the voltage generated by the voltage regulator circuit, as a function of the process parameters VTHN, VTHP, BN and BP, As a result, the process parameter variations are canceled, such that the circuit operating parameter remains substantially unchanged. This type of compensation is made possible because a given CMOS process has a "target" value of FET transconductance that determines circuit delay time, and yet is also sensitive to process variations. The transconductance itself is determined by the more fundamental process parameters of conduction threshold voltage and mobility. The above-described illustrative embodiments use the two more fundamental process parameters to determine an environmental parameter, e.g., supply voltage, that also affects the delay time. Variations in the supply voltage offset variations in the fundamental process parameters, such that the oscillation period of the ring oscillator circuit becomes substantially process independent.

The present invention may be further generalized as follows. Suppose that there are process parameters P1, P2, . . . , that specify an integrated circuit process condition, and that affect the circuit operating parameter X. Suppose that the circuit operating parameter X is also affected by the environmental parameters E1, E2, . . . . Examples of the process parameters P1, P2, . . . , are the NFET and PFET conduction threshold voltages $V_{THN}$ and $V_{THP}$, respectively, NFET and PFET channel mobilities $B_N$ and $B_P$, respectively, NFET and PFET gate capacitances, NFET and PFET drain capacitances, NFET and PFET Early voltages, NFET and PFET saturation parameters, and transit times. The Early voltage refers to a drain voltage above the conduction threshold voltage at which the FET current increases slightly due to effective shortening of the FET channel. This phenomenon is known as the Early effect. Examples of the environmental parameters E1, E2 . . . , are the power supply voltage, the FET current generator control voltages, active load control voltages, the back-bias voltages in case of floating ground-$V_{DD}$ devices, and operating temperature.

The invention can then be characterized as selecting the environmental parameter or parameters as a function of the process parameters, e.g., $E1=f_{E1}(P1, P2, \ldots)$, such that in the operating condition, the effect of the process variation is substantially canceled or otherwise significantly reduced. It can be seen that the circuit parameter X now depends on the process parameters in accordance with the formula $X=f_x(f_{E1}(P1, P2, \ldots), P1, P2, \ldots)$. Therefore, by choosing the $f_{E1}(PI, P2, \ldots)$ functional form properly, the circuit parameter X can be made independent of the process variations. In the illustrative embodiments described in conjunction with FIGS. 2 and 3 above, the circuit parameter X is the ring oscillator period, the process parameters are the FET conduction threshold voltages $V_{THN}$ and $V_{THP}$ and the FET channel mobilities $B_N$ and $B_P$, and the environmental parameter is the power supply voltage $V_{DD}$.

The above-described embodiments of the invention are intended to be illustrative only. For example, although the invention has been illustrated in conjunction with voltage regulator and ring oscillator circuits, it can be applied to any type of circuit or circuits, including, e.g., both integrated circuit and discrete component circuits. Moreover, the invention can be used with a variety of different process parameters, environmental parameters, and circuit operating parameters. Numerous other alternative embodiments may be devised by those skilled in the art without departing from the scope of the following claims.

What is claimed is:

1. A method of manufacturing a circuit, wherein an operating parameter of the circuit varies as a function $f_1$ of at least one process parameter and at least one environmental parameter, the method comprising the step of:

configuring the circuit such that the environmental parameter is a function $f_2$ of the process parameter, by preselection of the function $f_2$ based at least in part on a known characteristic of the function $f_1$ and without the use of feedback control of the environmental parameter based on detection of the process parameter, wherein the effect of the process parameter on the circuit operating parameter is at least partially offset by the effect of the process parameter on the environmental parameter.

2. The method of claim 1 wherein the circuit is a CMOS integrated circuit.

3. The method of claim 1 wherein the effect of the process parameter on the circuit operating parameter is substantially offset by the effect of the process parameter on the environmental parameter.

4. The method of claim 1 wherein the at least one process parameter comprises one or more of the following parameters: conduction threshold voltage, channel mobility, gate capacitance, drain capacitance, Early voltage, saturation parameter, and transit time.

5. The method of claim 1 wherein the at least one environmental parameter comprises one or more of the following parameters: power supply voltage, current generator control voltages, active load control voltage, back-bias voltage, and operating temperature.

6. The method of claim 1 wherein the circuit operating parameter is an oscillation period, the process parameter includes conduction threshold voltage and channel mobility, and the environmental parameter includes power supply voltage.

7. The method of claim 1 wherein the configuring step includes generating in a first portion of the circuit a reference voltage which is determined at least in part based on known process parameter variations of a second portion of the circuit.

8. The method of claim 7 wherein the first portion of the circuit is a voltage regulator portion of the circuit, and the second portion of the circuit is a portion which utilizes the reference voltage generated by the voltage regulator portion as a supply voltage.

9. The method of claim 7 wherein a back-bias effect associated with at least one transistor in the first portion of the circuit is utilized to offset a back-bias effect associated with at least one transistor in the second portion of the circuit.

10. A circuit having an operating parameter which varies as a function $f_1$ of at least one process parameter and at least one environmental parameter, the circuit comprising:

a first circuit portion for generating an output, wherein the first circuit portion is configured such that the environmental parameter is a function $f_2$ of the process parameter, by preselection of the function $f_2$ based at least in part on a known characteristic of the function $f_1$ and without the use of feedback control of the environmental parameter based on detection of the process parameter; and a second circuit portion configured to receive as an input the output generated by the first circuit portion, and operative to generate an output in accordance with the operating parameter, such that the effect of the process parameter on the circuit operating parameter in the second circuit portion is at least partially offset by the effect of the process parameter on the environmental parameter.

11. The circuit of claim 10 wherein the first and second circuit portions are portions of a CMOS integrated circuit.

12. The circuit of claim 11 wherein the at least one process parameter comprises one or more of the following parameters: conduction threshold voltage, channel mobility, gate capacitance, drain capacitance, Early voltage, saturation parameter, and transit time.

13. The circuit of claim 11 wherein the at least one environmental parameter comprises one or more of the following parameters: power supply voltage, current generator control voltages, active load control voltage, back-bias voltage, and operating temperature.

14. The circuit of claim 11 wherein the circuit operating parameter is an oscillation period, the process parameter includes conduction threshold voltage and channel mobility, and the environmental parameter includes power supply voltage.

15. The circuit of claim 11 wherein the first circuit portion generates a reference voltage which is determined at least in part based on known process parameter variations of the second circuit portion.

16. The circuit of claim 15 wherein the first circuit portion is a voltage regulator circuit, and the second circuit portion utilizes the reference voltage generated by the voltage regulator as a supply voltage.

17. The circuit of claim 15 wherein a back-bias effect associated with at least one transistor in the first circuit portion is utilized to offset a back-bias effect associated with at least one transistor in the second circuit portion.

18. A method of manufacturing an integrated circuit, wherein an operating parameter of the circuit varies as a function $f_1$ of both a process-related transistor conduction parameter and an applied supply voltage, the method comprising the step of:

configuring the circuit such that the applied voltage is a function $f_2$ of the conduction parameter, by preselection of the function $f_2$ based at least in part on a known characteristic of the function $f_1$ and without the use of feedback control of the applied supply voltage based on detection of the conduction parameter, wherein the effect of the conduction parameter on the circuit operating parameter is at least partially offset by the effect of the conduction parameter on the applied voltage.

19. An integrated circuit having an operating parameter which varies as a functions $f_1$ of both a process-related transistor conduction parameter and an applied supply voltage, wherein the applied voltage is selected as a function $f_2$ of the conduction parameter, by preselection of the function $f_2$ based at least in part on a known characteristic of the function $f_1$ and without the use of feedback control of the applied supply voltage based on detection of the conduction parameter, such that the effect of the conduction parameter on the circuit operating parameter is at least partially offset by the effect of the conduction parameter on the applied voltage.

20. An integrated circuit having an operating parameter which varies as a function $f_1$ of both a process-related transistor conduction parameter and an applied voltage, the circuit comprising:

a voltage regulator for generating the applied voltage as a function $f_2$ of the conduction parameter wherein the function $f_2$ is preselected based at least in part on a known characteristic of the function $f_1$ and without the use of feedback control of the applied voltage based on detection of the conduction parameter, such that the effect of the conduction parameter on the operating parameter is at least partially offset by the effect of the conduction parameter on the applied voltage; and a circuit portion having a supply voltage input coupled to an output of the voltage regulator, and operative to generate an output in accordance with the operating parameter.

* * * * *